(12) United States Patent
Alam

(10) Patent No.: US 8,283,965 B2
(45) Date of Patent: Oct. 9, 2012

(54) VOLTAGE LEVEL SHIFTER

(75) Inventor: Akhtar W Alam, Kakarmatta Varanasi U.P. (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/801,902

(22) Filed: Jun. 30, 2010

(65) Prior Publication Data

US 2011/0001538 A1    Jan. 6, 2011

Related U.S. Application Data

(60) Provisional application No. 61/222,673, filed on Jul. 2, 2009.

(51) Int. Cl.
*H03L 5/00* (2006.01)

(52) U.S. Cl. ......................................................... 327/333

(58) Field of Classification Search .................. None
See application file for complete search history.

(56) References Cited

U.S. PATENT DOCUMENTS

| | | |
|---|---|---|
| 3,906,254 A | 9/1975 | Lane et al. |
| 4,490,633 A | 12/1984 | Noufer et al. |
| 5,289,061 A | 2/1994 | Sugibayashi et al. |
| 5,650,742 A * | 7/1997 | Hirano ........................... 327/333 |
| 7,230,469 B2 * | 6/2007 | Benzer et al. .................. 327/333 |
| 7,675,768 B1 * | 3/2010 | Kim ................................. 365/149 |
| 7,933,160 B2 * | 4/2011 | Kim ................................. 365/207 |
| 2009/0091368 A1 | 4/2009 | Banerjee et al. |

FOREIGN PATENT DOCUMENTS

| | | |
|---|---|---|
| JP | 6-290595 | 10/1994 |
| JP | 2000-224024 | 8/2000 |

OTHER PUBLICATIONS

Ishihara et al., "Level Conversion for Dual-Supply Systems", *IEEE Transactions*, vol. 12, No. 12, Feb. 2004, pp. 185-195.
Ping-Yuan et al., "A Voltage Level Converter Circuit Design with Low Power Consumption", *ASICON 2005*, Oct. 2005, pp. 358-359.
UK Search Report dated Oct. 19, 2010 for GB 1011038.5.

\* cited by examiner

*Primary Examiner* — Lincoln Donovan
*Assistant Examiner* — Khareem E Almo
(74) *Attorney, Agent, or Firm* — Nixon & Vanderhye P.C.

(57) ABSTRACT

A voltage level shifter is provided for receiving an input signal from an input voltage domain and converting said signal to a shifted signal in a shifted voltage domain. The voltage level shifter has an input, switching circuitry, a pass transistor and an output. The switching circuitry is configured to isolate an output of said pass transistor from said supply voltage rail when said input voltage domain corresponds to a logical zero.

19 Claims, 10 Drawing Sheets

| Different PVT Corner Cases of 32LP technology | rise delay difference (Arch1-Arch3) [in ps] | Fall delay difference (Arch1-Arch3) [in ps] | Dynamic Power Ratio Arch1/Arch3 | Leakage Power Ratio Arch1/Arch3 |
|---|---|---|---|---|
| ff_nominal_min_1p10v_1p10v_125c | 15.1 | 10.7 | 1.2 | 0.8 |
| ff_nominal_min_1p10v_1p10v_m40c | 7.8 | 10.3 | 1.2 | 0.6 |
| ff_nominal_min_1p10v_1p155v_125c | 12.6 | 11.2 | 1.1 | 0.8 |
| ff_nominal_min_1p10v_1p155v_m40c | 6.4 | 10.9 | 1.1 | 150.2 |
| ff_nominal_min_1p155v_1p155v_125c | 14.8 | 10.1 | 1.2 | 0.8 |
| ff_nominal_min_1p155v_1p155v_m40c | 8.4 | 9.6 | 1.2 | 129.6 |
| ss_nominal_max_0p76v_0p76v_125c | 18.3 | 31.8 | 1.1 | 9.3 |
| ss_nominal_max_0p76v_0p76v_m40c | -12.4 | 41.0 | 1.0 | 4489.8 |
| ss_nominal_max_0p76v_0p90v_125c | 5.1 | 34.7 | 1.0 | 6.9 |
| ss_nominal_max_0p76v_0p90v_m40c | -2.0 | 36.2 | 0.8 | 3160.9 |
| ss_nominal_max_0p76v_1p045v_m40c | -13.2 | 19.2 | 0.7 | 1946.6 |
| ss_nominal_max_0p90v_0p90v_125c | 17.1 | 20.5 | 1.2 | 7.2 |
| ss_nominal_max_0p90v_0p90v_m40c | -0.7 | 22.8 | 1.1 | 2835.7 |
| ss_nominal_max_0p90v_1p045v_125c | 6.9 | 22.8 | 1.0 | 5.4 |
| ss_nominal_max_0p90v_1p045v_m40c | -2.1 | 25.1 | 1.0 | 1808.9 |
| ss_nominal_max_0p90v_1p10v_125c | 3.9 | 23.5 | 1.0 | 4.9 |
| ss_nominal_max_0p90v_1p10v_m40c | -3.3 | 25.6 | 1.0 | 1445.8 |
| ss_nominal_max_0p90v_1p155v_125c | 1.8 | 24.1 | 1.0 | 4.5 |
| ss_nominal_max_0p90v_1p155v_m40c | -4.7 | 25.6 | 0.9 | 1114.2 |

Fig 7A

| Different PVT Corner Cases of 32LP technology | rise delay difference (Arch1-Arch3) [in ps] | Fall delay difference (Arch1-Arch3) [in ps] | Dynamic Power Ratio Arch1/Arch3 | Leakage Power Ratio Arch1/Arch3 |
|---|---|---|---|---|
| ss_nominal_max_1p045v_1p045v_125c | 16.8 | 15.4 | 1.2 | 5.5 |
| ss_nominal_max_1p045v_1p045v_m40c | 4.4 | 15.7 | 1.1 | 1511.2 |
| ss_nominal_max_1p045v_1p10v_125c | 13.7 | 16.1 | 1.1 | 5.0 |
| ss_nominal_max_1p045v_1p10v_m40c | 3.1 | 16.5 | 1.1 | 1247.9 |
| ss_nominal_max_1p045v_1p155v_125c | 10.8 | 16.7 | 1.1 | 4.5 |
| ss_nominal_max_1p045v_1p155v_m40c | 2.0 | 17.2 | 1.1 | 999.2 |
| ss_nominal_max_1p10v_1p10v_125c | 16.8 | 14.1 | 1.2 | 5.0 |
| ss_nominal_max_1p10v_1p10v_m40c | 5.7 | 14.1 | 1.1 | 1140.4 |
| ss_nominal_max_1p10v_1p155v_125c | 13.9 | 14.8 | 1.1 | 4.5 |
| ss_nominal_max_1p10v_1p155v_m40c | 4.4 | 14.8 | 1.1 | 927.9 |
| ss_nominal_max_1p155v_1p155v_125c | 16.7 | 13.2 | 1.2 | 4.6 |
| ss_nominal_max_1p155v_1p155v_m40c | 6.8 | 12.9 | 1.2 | 836.8 |
| tt_nominal_max_0p80v_0p80v_85c | 13.3 | 23.4 | 1.1 | 17.5 |
| tt_nominal_max_0p80v_1p00v_85c | 0.8 | 26.2 | 1.0 | 11.1 |
| tt_nominal_max_0p80v_1p10v_85c | -3.1 | 26.5 | 0.9 | 8.9 |
| tt_nominal_max_1p00v_1p00v_25c | 9.3 | 14.4 | 1.1 | 126.4 |
| tt_nominal_max_1p00v_1p00v_85c | 13.7 | 14.4 | 1.2 | 11.3 |
| tt_nominal_max_1p00v_1p10v_25c | 5.7 | 15.5 | 1.1 | 97.7 |
| tt_nominal_max_1p00v_1p10v_85c | 9.0 | 15.6 | 1.1 | 9.1 |
| tt_nominal_max_1p10v_1p10v_25c | 10.4 | 12.1 | 1.2 | 95.6 |
| tt_nominal_max_1p10v_1p10v_85c | 14.07 | 12.27 | 1.2 | 9.1 |

Fig 7B

| Level-Shifter Architecture | PVT Corners | vss_leak_0 (uA) | vss_leak_1 (uA) | total_leak (uA) |
|---|---|---|---|---|
| Fig 1 Dual Nwell Architecture | leak_fff_125_1p155_1p155 | 0.12 | 0.15 | 0.27 |
| Single Nwell Architecture of Fig. 3 embodiment | leak_fff_125_1p155_1p155 | 0.23 | 0.12 | 0.35 |

Fig 8

| Level-Shifter Architecture | PVT corners | rise_delay (ns) | fall_delay (ns) | total_dynpwr (uW) |
|---|---|---|---|---|
| Dual Nwell Architecture of Fig 1 | del_ss_m40_0p72_0p72 | 3.86 | 3.22 | 45.78 |
| | del_ss_m40_0p72_1p155 | 1.25 | 2.22 | 104.20 |
| | del_tt_25_0p72_1p0 | 1.00 | 1.38 | 81.47 |
| Single Nwell Architecture of Fig 3 embodiment | del_ss_m40_0p72_0p72 | 4.05 | 2.71 | 49.32 |
| | del_ss_m40_0p72_1p155 | 1.92 | 7.22 | 374.30 |
| | del_tt_25_0p72_1p0 | 1.08 | 1.09 | 104.30 |

Fig 9

VOLTAGE LEVEL SHIFTER

This application claims priority to U.S. Provisional Application No. 61/222,673, filed Jul. 2, 2009, the entire contents of which are hereby incorporated by reference.

BACKGROUND OF THE INVENTION

1. Field of the Invention

The field of the invention relates to voltage level shifters for shifting the voltage level between two different voltage domains.

2. Description of the Prior Art

It is known to provide voltage level shifters to convert a signal from one voltage domain to a signal suitable for another voltage domain. This allows circuits that operate different voltage levels to interface with each other.

In the design of Application Specific Integrated Circuits (ASIC), circuit design is often performed via the implementation of Standard Cells. In this way ASIC manufacturers can create functional blocks with known electrical characteristics such as propagation delay, capacitance and inductance that can be represented in third party circuit design tools. Standard Cell design is the utilisation of these functional blocks to achieve high gate density and good electrical performance. Accordingly the constraints on circuit components (e.g. electrical characteristics) for use in Standard Cell design are carefully controlled.

Known voltage level shifters for inclusion in Standard Cell design typically comprise dual voltage NWELL architectures that are costly to fabricate and consume a comparatively large circuit area. A problem with known Standard Cell library level shifters are that they have a larger than ideal area, have high leakage current and having slow voltage-shift response time. There is no known implementation of a voltage shifter having a single NWELL that is practically possible for implementation in a Standard Cell library.

Accordingly there is a need for voltage level shifter suitable for employing in a Standard Cell Library that has reduced area, reduced leakage, faster response time and is more cost-effective to fabricate.

FIG. 1 schematically illustrates a known voltage level shifter as employed in a Standard Cell Library. The circuit of FIG. 1 comprises a plurality of Complementary Metal Oxide Semiconductor (CMOS) transistors and comprises two NWELLs. The Standard Cell of FIG. 1 is a double height cell due to the fact that there is a separate isolated NWELL of the PMOS of the pass transistor of this circuit. The Standard Cell of FIG. 1 is a circuit 100 comprising a PMOS transistor 102 where the transistor source is connected to a low voltage domain (VDDL) and the transistor drain is connected to the drain of an NMOS transistor 104 whose source is connected to the ground voltage. The gate of the NMOS transistor 104 is connected an input voltage Vin_L which can either be at logic level zero or logic level 1. The PMOS transistor 102 and the NMOS transistor 102 together represent a first isolated NWELL of the circuit 100.

A second (separate) NWELL is formed in the circuit of the Standard Cell 100 by a set of four PMOS transistors 106, 108, 110, 112. The sources of PMOS transistors 106 and 108 are connected to a high voltage domain VDDH. In addition to the four PMOS transistors 106, 108, 110, 112, there are a further two NMOS transistors 114, 116 which complete a sub-circuit of a total of six transistors that are connected between the high voltage domain VDDH and a ground potential voltage line 117. In this six-transistor sub-circuit, the gates of the PMOS transistor 106 and NMOS transistor 114 are connected to the input voltage Vin_L, whilst the gates of the PMOS transistor 108 and NMOS transistor 116 are connected to a circuit node 152 situated between the drains of the PMOS 102 and the NMOS 104 of the first NWELL.

The PMOS transistors 110 and 112 are cross-coupled in the sense that the gate of PMOS transistor 112 is connected to the drain of NMOS transistor 114 whilst the gate of PMOS transistor 110 is connected to a node 156 connecting the drains of the transistors 116 and 112. The output of the Standard Cell 100 Vout_H is provided via a signal path comprising a first inverter 118 and a second inverter 120 connected in series. The reason that two NWELLs are required in the circuit 100 is that it is necessary to keep the NWELL of the pass transistor PMOS 102 separated from the regular NWELL formed by the transistors 106, 108, 110, 112. In fact, it is desirable to keep the body of the PMOS transistor 102, whose source is connected to the low voltage domain VDDL, at the same corresponding source potential level i.e. VDDL. Otherwise, if the substrate of the PMOS transistor 102 were kept in the regular voltage domain VDD, then the body-to-source potential of the PMOS 102 would increase due to the so-called "body effect" of the transistor and as a consequence the threshold voltage of the PMOS transistor 102 would increase. Note that the PMOS 102 conducts when the voltage between the gate and the source is less than the threshold voltage $V_t$. Accordingly, a high threshold voltage $V_t$ would have a consequence that it would be difficult to switch off the PMOS transistor 102. This situation is undesirable. Hence the body of the PMOS 102 is maintained at the low source voltage level VDDL by isolating the two transistors 102 and 104 in a separate NWELL.

The dual NWELL structure of the circuit 100 and the double height cell mean that the area of the cell is large and costly to fabricate. The Standard Cell circuit 100 also consumes a large amount of power and has significant current leakage.

In the circuit of FIG. 1, when the input voltage Vin_L corresponds to a logical zero, in the first NWELL the NMOS transistor 104 is off whilst the PMOS transistor 102 is switched on. In the second NWELL, when the input voltage is a logical zero, the NMOS transistor 114 and the PMOS transistor 112 both switch off so that the node 154 is at the higher voltage domain VDDH whereas the node 156 is at zero voltage. However, the PMOS transistor 108 is metastable when the input voltage is a logical zero, which means that the output of the pass transistors 102 and 104 is not reliably isolated from the higher voltage domain VDDH. Accordingly, the node 156 is at an indefinite voltage and thus corresponds to only a so-called "weak zero" voltage. This problem with the metastability of the PMOS transistor 108 for the circuit 100 occurs only in the circumstance where the input voltage corresponds to a logical zero. When the input voltage Vin_L corresponds to a logical 1 in the circuit of FIG. 1, the transistors 106, 110, 116 and 102 all switch off reliably whilst the transistors 114, 104, 108 and 112 are all switched on and the output voltage Vout_H corresponds to the high voltage domain VDDH.

Thus in the known Standard Cell voltage level shifter circuit of FIG. 1, there is a problem of ensuring the correct operation of the pass transistors 102 and 104 of the first NWELL that can arise due to metastability of one of the transistors in the switching circuit i.e. PMOS transistor 108. This problem arises when the input voltage has a logic level zero. Furthermore, it is desirable to provide a Standard Cell voltage level shifter that has reduced area and reduced leakage current relative to the circuit 100 of FIG. 1.

FIG. 2 schematically illustrates a known single NWELL voltage level shifter for use in a dual-supply voltage design described in the search paper "Level Conversion for Dual-Supply Systems" by Fujio Ishihara and Farhana Sheikh, IEEE Transactions on Very Large Scale Integration (VLSI) Systems, volume 12, no. 2, February 2004. The circuit of FIG. 2 is a diode based single well voltage level shifter but this single NWELL circuit does not comply with the strict requirements of a Standard Cell voltage level shifter. The diode-based design of FIG. 2 can only work in an input/output circuit where there is the option to use thick oxide and higher voltage transistors. Previously known topologies for single NWELL voltage level shifters are simply not practical for use in a Standard Cell library of very deep sub-micron technology due to their physical properties.

The single NWELL circuit 200 of FIG. 2 comprises an NMOS pass transistor 210 whose source is connected to the input voltage Vin_L and whose drain is connected to a circuit node 250. The circuit 200 further comprises a PMOS transistor 212 whose source is connected to a high voltage domain VDDH and whose drain is connected to the drain of an NMOS transistor 214. The source of the transistor 214 is in turn connected to a ground voltage. The circuit 200 comprises a fourth CMOS transistor, which is a PMOS transistor 216 whose source and drain are connected between the high voltage domain VDDH and the node 250 and whose gate is connected to a further circuit node 252 on an output line of the circuit 200. The signal passes through a single inverter 218 prior to being output as Vout_H.

In the circuit 200, when the input voltage Vin_L corresponds to a logical zero the pass transistor 210 is switched and the PMOS transistor 212 is also switched on. For logical zero input, the NMOS transistor 214 is strongly off but the PMOS transistor 216 is only weakly off (i.e. it is metastable). Due to the metastability of the PMOS transistor 216, the node 252 does not have a well-defined voltage and this node will initially be at a voltage of zero before rising to the high voltage level VDDH. After passing through the inverter 218, the output voltage will be zero. The metastabilty of the PMOS transistor 216 also results in a higher level of leakage current than would be the case if there were no metastability in the circuit 200. Due to the metastability of the PMOS transistor 216, there is also a problem with a poorly defined voltage level at the node 250 at the output of the pass transistor 210.

When the input Vin_L to the circuit 200 of FIG. 2 corresponds to a logical one all of the transistors 210, 214 216 are switched on whereas the PMOS transistor 212 whose gate is connected to the node 250 is off, but only weakly off. Thus the transistor 212 is metastable in this situation. This gives rise to a uncertain voltage at the node 250 which should be at a high voltage level VDDH but in fact is only weakly at the desired voltage level. The voltage level at the node 252 should be zero so that the voltage at the output of the inverter 280 should correspond to VDDH. The circuit of FIG. 2 corresponds to only a half-feedback circuit. As explained above, there are problems caused by the metastability of some of transistors 216 and 212 for voltage inputs of logical zero and logical one respectively. For a more efficient operation of the voltage level shifter of FIG. 2, it is desirable that the node 250 should be at a stronger zero voltage for an input voltage of logical zero. This would reduce leakage current of the system.

Circuit 200 of FIG. 2 corresponds to so called half-latch circuit and causes the circuit 200 to malfunction for an input voltage of logical zero. When the input voltage Vin_L is a logical 0 then the node 250 is driven by the NMOS pass transistor 210 and a further NMOS transistor (not shown in FIG. 2) that drives the input Vin_L. Both of these two NMOS transistors will be very weak as a result of the difference between the gate to source voltage Vgs and the threshold voltage $V_t$ will be small and closer to zero. This will mean that the two NMOS transistors including the transistor 210 will not be in the desired "linear region" of the transistor. In the linear region the gate to source voltage $V_{gs}$ exceeds the threshold voltage $V_t$ and the body to source voltage $V_{bs}$ is less than the difference between $V_{gs}$ and $V_t$. As a result of this instability, the single NWELL voltage shifter of FIG. 2 cannot be employed in the Standard Cells library of deep sub micon technology. Furthermore, in the so-called "FF corner" corresponding to fast NMOS and fast PMOS transistors and high temperature corners where leakage current is likely to be high, then the potential of the node 250 of FIG. 2 is likely to become non-zero even for a logical input of zero due to the high resistive path between the input voltage Vin_L and the node 250. As a consequence, the PMOS transistor 212 would likely go into a "triode region" (i.e. a linear region) which will weaken the logic of the node 252 at the output of the circuit 200.

Thus there is a requirement for a voltage level shifter such as a single NWELL design for use in Standard Cells that consumes less area and is more cost effective to fabricate yet which is stable for inputs of both logical zero and logical 1.

SUMMARY OF THE INVENTION

According to a first aspect the present invention provides a voltage level shifter for receiving an input signal from an input voltage domain and converting said signal to a shifted signal in a shifted voltage domain, said voltage level shifter comprising: an input for receiving said input signal from said input voltage domain; switching circuitry arranged between a voltage rail at a supply voltage and a voltage rail at a ground voltage; a pass transistor located in a path between said input and said switching circuitry; an output connected to a node of said switching circuitry for outputting said shifted signal; wherein said switching circuitry is configured to isolate an output of said pass transistor from said supply voltage rail when said input voltage domain corresponds to a logical zero.

The present invention recognises that a voltage level shifter with improved performance characteristics relative to previously known Standard Cell voltage level shifters can be provided by ensuring that the switching circuitry of the voltage level shifter is configured to isolate an output of the pass transistor from the supply voltage rail when the input voltage domain corresponds to a logical zero. This ensures that there is a strong zero at the output of the pass transistor, which in turn ensures correct operation of the pass transistor and avoids the high-threshold phenomenon and the metastability of transistors of the switching circuitry exhibited in previously known voltage level shifter configurations. Isolating the output of the pass transistor from the supply voltage level via the configuration of the switching circuitry results in better slew at the output of the voltage level shifter and allows for a sharper transition between voltage levels.

In one embodiment the switching circuitry of the voltage level shifter is configured to provide full feedback. In previously known voltage level shifters having single NWELL designs (i.e. ones that are not suitable for implementation in Standard Cell libraries) the switching circuitry provides only half feedback and this can give rise to an indefinite voltage at the output of the pass transistor. Providing full feedback allows for a more reliable and robust circuit and means that the voltage level shifter can be provided with a single NWELL. Obviating the need for provision of a second NWELL to isolate the pass transistor from the rest of the switching circuitry makes it easier to reduce the circuit area of the design.

Although the switching circuitry could have many different configurations, in one embodiment the switching circuitry comprises a pull-up transistor connected to the input via the pass transistor and further comprises a pull-down transistor connected to the input via the signal path bypassing the pass transistor.

Although the switching circuitry could comprise any one of a number of different arrangements of switches, in one embodiment the switching circuitry comprises inverter circuitry. The inverter circuitry provides a convenient means of isolating the output of the pass transistor from the supply voltage rail when the input voltage domain corresponds to a logical zero.

The inverter circuitry could comprise any one of a number of different types of switching elements forming the inverter, but in one embodiment the inverter circuitry comprises a single NMOS transistor and a single PMOS transistor. This is easy to implement and cost effective to manufacture.

In one embodiment the pass transistor has a low threshold voltage relative to the threshold voltage of the PMOS transistor of the inverter circuitry. This provides a voltage level shifter with more robust characteristics.

In one embodiment, the PMOS transistor of the inverter circuitry serves to perform the isolation of the output of the pass transistor from the supply voltage rail when the input voltage domain corresponds to a logical zero.

In one embodiment, the switching circuitry comprises a first node located between a drain of the NMOS transistor and the drain of the PMOS transistor of the converter circuitry.

In some embodiments, the switching circuitry comprises a second node located between the drain of the pull-up transistor and a drain of the pull-down transistor of the switching circuitry and an input of the inverter circuitry is connected to the second node. This arrangement of the switching circuitry provides full feedback in the circuit configuration that is straightforward to implement and is area-efficient.

In some embodiments the output of the inverter circuitry is connected to an input of the pull-up transistor.

Although the output of a switching circuitry could be provided as a shifted digital signal via a number of alternative exit paths, in one embodiment the voltage level shifter comprises at least one inverter connected in series and a signal path leading to the output (i.e. exit path).

It will be appreciated that the voltage level shifter according to the present technique could be employed in a number of different environments. However, in one embodiment the voltage level shifter is a Standard Cell component in a Standard Cell library of a circuit design tool. This represents a more area-efficient circuit having reduced leakage and improved performance characteristics relative to previously known Standard Cell voltage level shifters.

In one embodiment, the switching circuitry of the voltage level shifter comprises at least one Complementary Metal Oxide Semiconductor (CMOS) transistor. In an alternative embodiment, the switching circuitry comprises at least one Carbon Nano-Tube Field Effect Transistor. It will be appreciated that the voltage level shifter according to the present technique can be implemented using further alternative types of transistor.

In one embodiment, the voltage level shifter comprises a single voltage domain NWELL. This enables the area of the voltage level shifter to be reduced relative to the dual NWELL design and reduces the process cost by offering a lower resolution NWELL mask for fabrication.

In some embodiments the voltage level shifter has a single height rather than a double height.

According to a second aspect the present invention provides a method of shifting a voltage level voltage level of input signal from an input voltage domain by converting said input signal to a shifted signal in a shifted voltage domain, said method comprising:
  receiving at an input said input signal from said input voltage domain;
  arranging switching circuitry between a voltage rail at a supply voltage and a voltage rail at a ground voltage;
  locating a pass transistor in a path between said input and said switching circuitry;
  connecting an output to a node of said switching circuitry for outputting said shifted digital signal;
  wherein said switching circuitry is configured to isolate an output of said pass transistor from said supply voltage rail when said input voltage domain corresponds to a logical zero.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 7A and 7B are tables schematically illustrating a comparison between the known dual Nwell architecture of FIG. 1 and the single Nwell architecture of the embodiment of FIG. 3 for the characteristics of rise delay, fall delay, dynamic power ratio and leakage power ratio;

FIG. 8 is a table providing the comparison of the leakage characteristics of the known Standard Cell voltage shifter of FIG. 1 and the embodiment of FIG. 3; and FIG. 9 is a table that schematically illustrates a comparison between delay and dynamic power characteristics of the known Standard Cell voltage level shifter of FIG. 1 compared with the voltage level shifter of the embodiment of FIG. 3.

DESCRIPTION OF EMBODIMENTS

Figure 3:
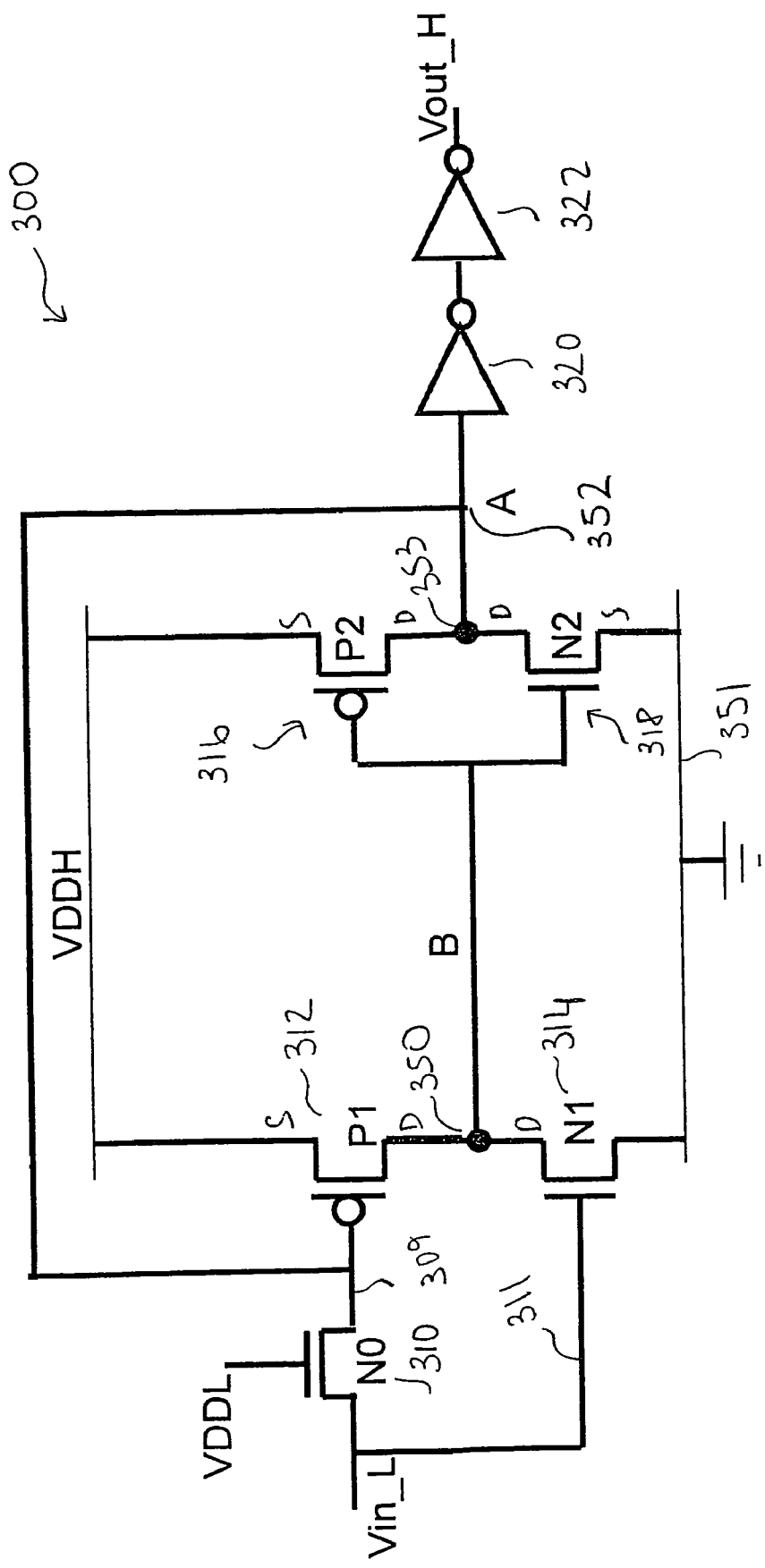
FIG. 3 schematically illustrates a voltage level shifter according to a first embodiment of the present invention.

FIG. 3 schematically illustrates a Single-well voltage level shifter design suitable for a Standard Cell according to a first embodiment of the present invention. The circuit comprises an NMOS pass transistor 310 and four transistors 312, 314, 316, 318 connected between a high voltage domain VDDH (source voltage) and a ground voltage rail 351. These four transistors comprise a first PMOS transistor 312 whose gate is connected to the output of the pass transistor 310 and whose source is connected to the high voltage domain VDDH. The drain of the PMOS transistor 312 is connected to the drain of an NMOS transistor 314 and the source of that NMOS transistor 314 is in turn connected to the ground rail 351.

The pair of transistors comprising the PMOS transistor 316 and the NMOS transistor 318 together form an inverter circuit. The source of the PMOS transistor 316 is connected to the high voltage domain VDDH, whereas the source of the NMOS transistor 318 is connected to the ground voltage rail 351. The gates of the inverter circuit transistors 316, 318 are connected to a point between the drains of the PMOS transistor 312 and the NMOS transistor 314 via a node 350. A further two inverters 320 and 322 are provided prior to the output Vout_H of the voltage level shifter circuit.

In the circuit of FIG. 3, a signal path connects a point 352 on the output path derived from a node 353 between the drains of the PMOS transistor 316 and the NMOS transistor 318 of the inverter and connects the point 352 back round to a wire 309 connecting the output of the pass transistor 310 to the gate of the PMOS transistor 312. The gate of the NMOS pass transistor 310 is connected to the "TIEHI cell" (a standard cell system used to connect the power supply at the CMOS gate) such that the low voltage domain VDDL is supplied at the gate of the pass transistor 310. The circuit topology of FIG. 3 offers a single NWELL voltage level shifter that is practically realisable for use in a Standard Cell library of deep submicron technology. The layout design of the topology of the circuit of FIG. 3 is straightforward and can be done using an automatic circuit design tool.

Figure 1:
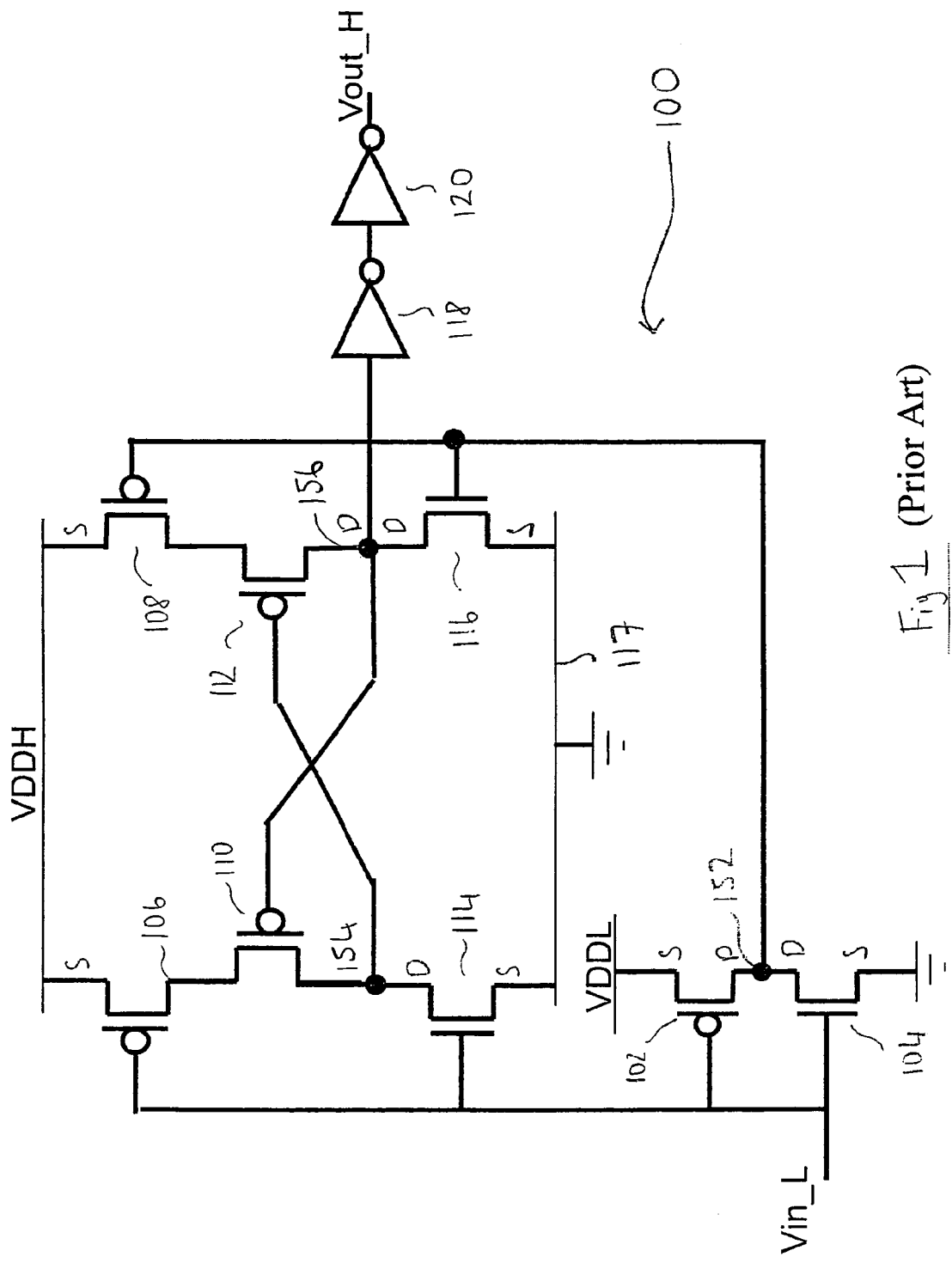
FIG. 1 schematically illustrates a known dual NWELL voltage level shifter employed in Standard Cell libraries.

The area of the circuit 300 is less than the area of the previously known Standard Cell of FIG. 1. For a given process, the leakage of the circuit corresponding to the topology of FIG. 3 is less than the leakage of the voltage level shifter of the Standard Cell library shown in FIG. 1. The level shifter of FIG. 3 is also faster than the level shifter of FIG. 1 for a given process.

In the embodiment of FIG. 3, the pass transistor 310 is implemented as a low threshold voltage transistor whereas the PMOS transistor 316 that isolates the node 352 from the output of the pass transistor 310 when there is a logic input zero is implemented as a comparatively high threshold voltage transistor. This makes the design more robust. The transistor 312 can be viewed as a pull-up transistor connected to the input voltage via the pass transistor 310 whereas the NMOS transistor 314 can be seen as a pull-down transistor, which is connected to the input Vin_L via a signal path 311 that bypasses the pass transistor 310.

The input to the level shifter of FIG. 3 is an analogue input. However, it will be appreciated that a digital input signal could alternatively be used.

Figure 4:
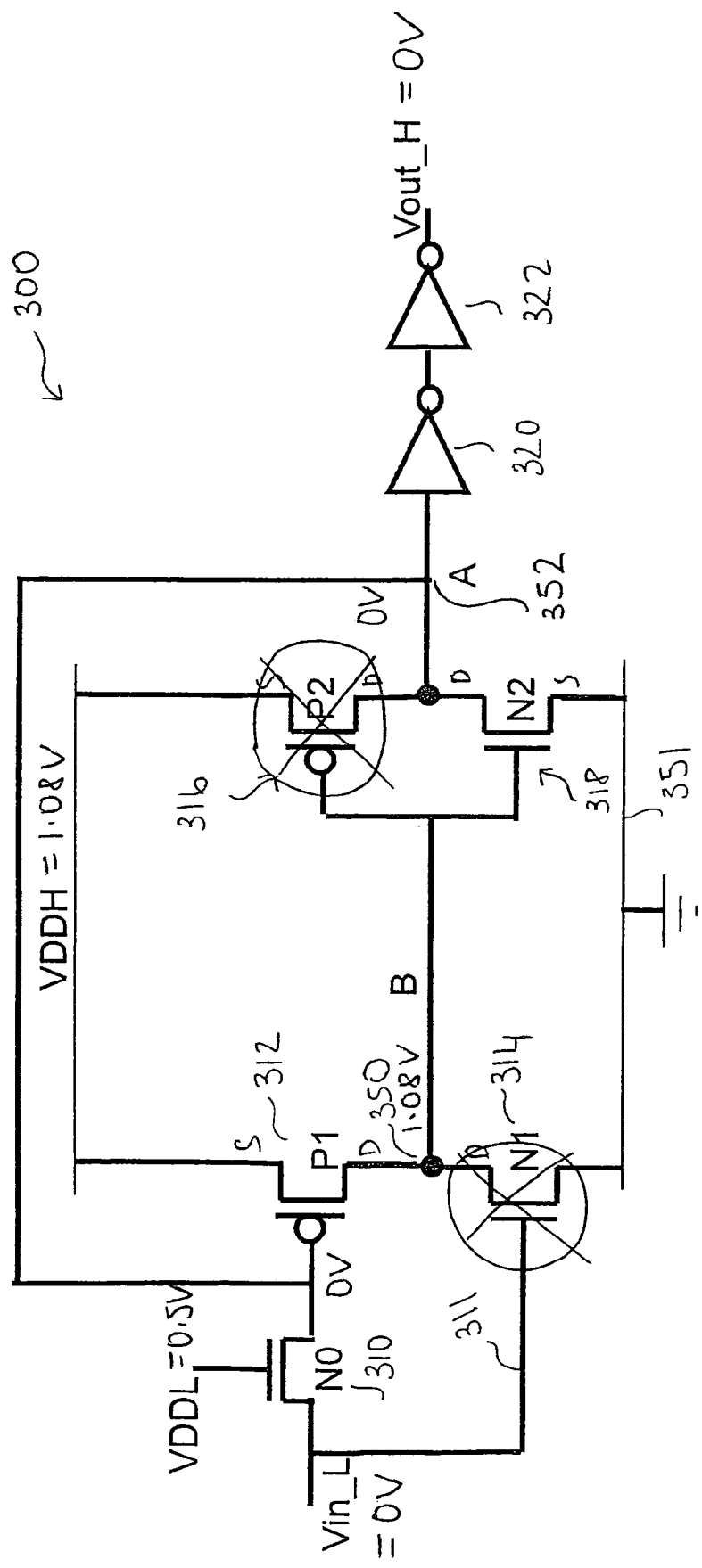
FIG. 4 schematically illustrates the configuration of the voltage level shifter of FIG. 3 with an input supply voltage corresponding to a logical zero.

FIG. 4 schematically illustrates the states of the various transistors of the circuit of FIG. 3 when the voltage input Vin_L corresponds to a logic value of zero i.e. Vin_L=0. As shown in FIG. 4, when the input voltage corresponds to zero Volts, the pass transistor 310 is switched on. The PMOS transistor 312 and the NMOS transistor 318 of the inverter are also both switched on. However, the NMOS transistor 314 and the PMOS transistor 316 are both strongly off. The fact that the PMOS transistor 316 is strongly off allows a strong zero voltage to be obtained at the node 352 that connects to the output of the pass transistor 310. The presence of the PMOS transistor 316 means that at node 352 there is no path to VDDH at the node 352 when the logical input is zero. This addresses the metastability problems identified in the circuit of FIG. 2.

As shown in the FIG. 4, for an input voltage of logical zero, the voltage at node 350 corresponds to VDDH, in this particular embodiment corresponding to 1.08V, the voltage at the output of the pass transistor 310 corresponds to zero volts as does the voltage at the node 352. This results in zero volts at the output of the inverter 322.

Figure 5:
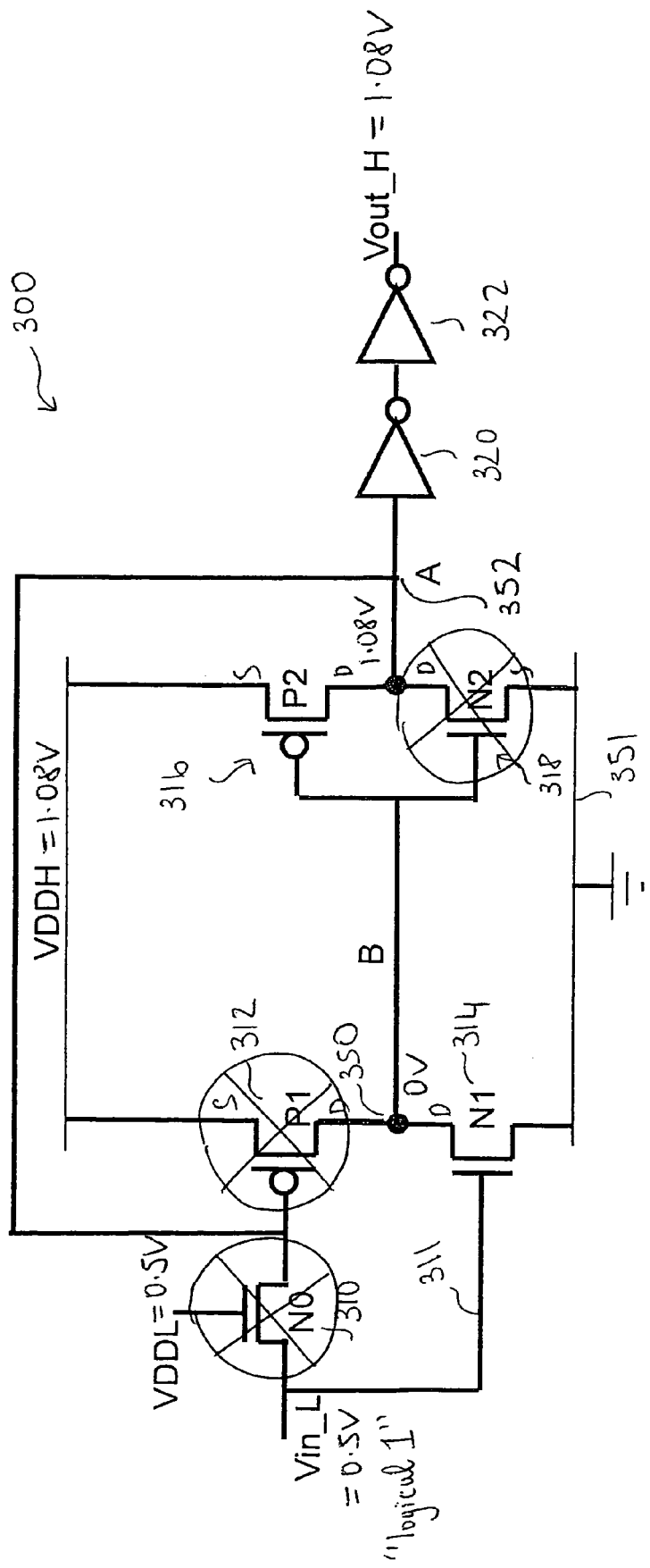
FIG. 5 schematically illustrates configuration of the voltage level shifter of FIG. 3 where the input supply voltage corresponds to a logical one.

FIG. 5 schematically illustrates a circuit of the embodiment of FIG. 3 in the case where the input voltage corresponds to a logical one. In this case, the input voltage of logical one corresponds to Vin_L=0.5 V. As shown in FIG. 5, the pass transistor 310 will be off because Vin_L=0.5V, which is the same as the low voltage domain VDDL. Since the gate to source voltage of the pass transistor 310 is zero, the transistors switches off. The PMOS transistor 312 and the NMOS transistor 318 of the inverter are also switched off when the logical input corresponds to one. However, the NMOS transistor 314 will be on and the PMOS transistor 316 of the inverter will also be switched on. As a result, the voltage at node 352 will correspond to VDDH (i.e. 1.08V) and the voltage at the node 350 will correspond to zero volts. When the NMOS transistor 314 is on, it pulls the node 350 down to the ground potential and hence the PMOS transistor 316 is switched on and the node 352 is pulled up to the high voltage domain VDDH. As a result of this, the output voltage corresponds to VDDH (1.08V).

Figure 2:
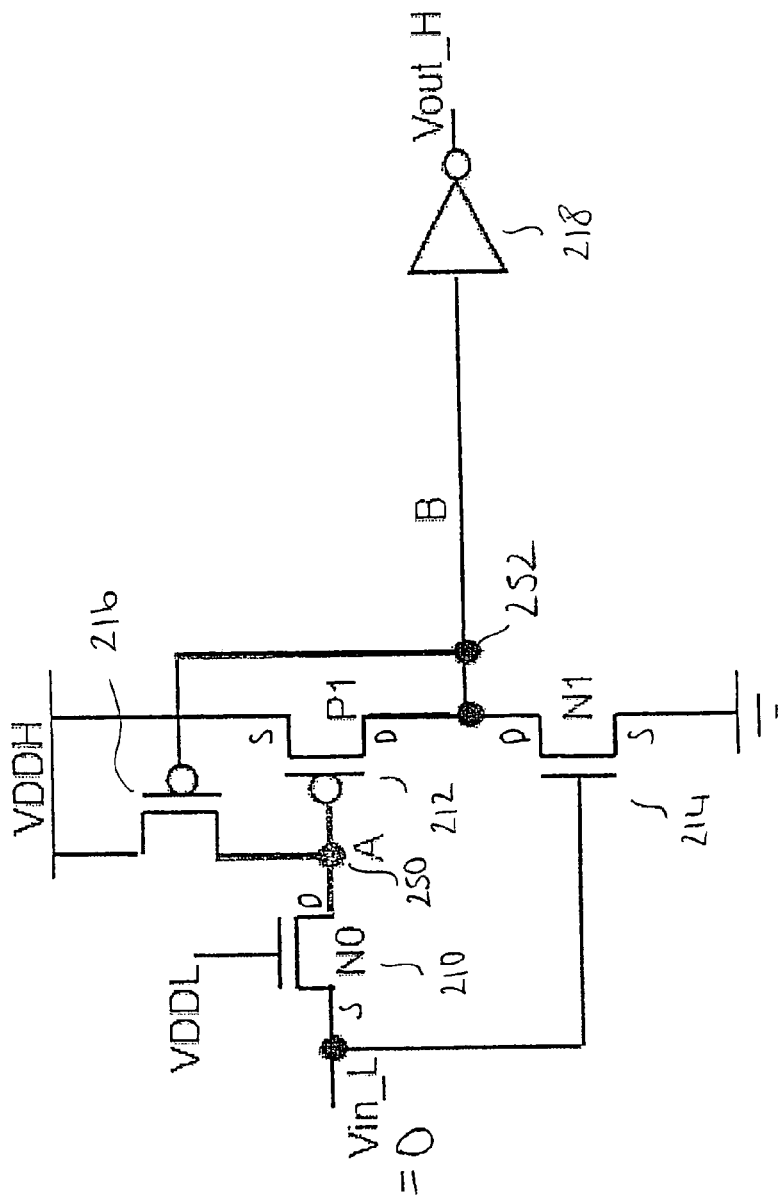
FIG. 2 schematically illustrates a known single NWELL voltage level shifter that is not suitable for use in the Standard Cell library.

The circuit of FIG. 3 corresponds to a full-feedback system in contrast to the half-feedback system of FIG. 2. The position of the node 352 is important in determining the ability to obtain a strong zero voltage there for logical zero input. In the arrangement of FIG. 3, this is achieved by connecting the output of the inverter transistor 316, 318 to the input (i.e. the gate) of the PMOS transistor 312. The circuit of FIG. 3 results in improved "slew" at the output Vout_H and a sharper transition than is achievable by the known single well voltage level shifter of FIG. 2. The circuit arrangement of FIG. 3 is intended to isolate an output of the pass transistor 310 from VDDH when the input voltage Vin_L has a logic level zero. In the embodiment of FIG. 3 the characteristics of the voltage level shifter are as follows:

| Minimum input | 0.7 Volts |
|---|---|
| Maximum output voltage | 1.55 Volts |
| Maximum temperature 125 C. | Minimum temperature −40 C. |

The level shifter of FIG. 3 also has a single height and a single NWELL.

Figure 6:
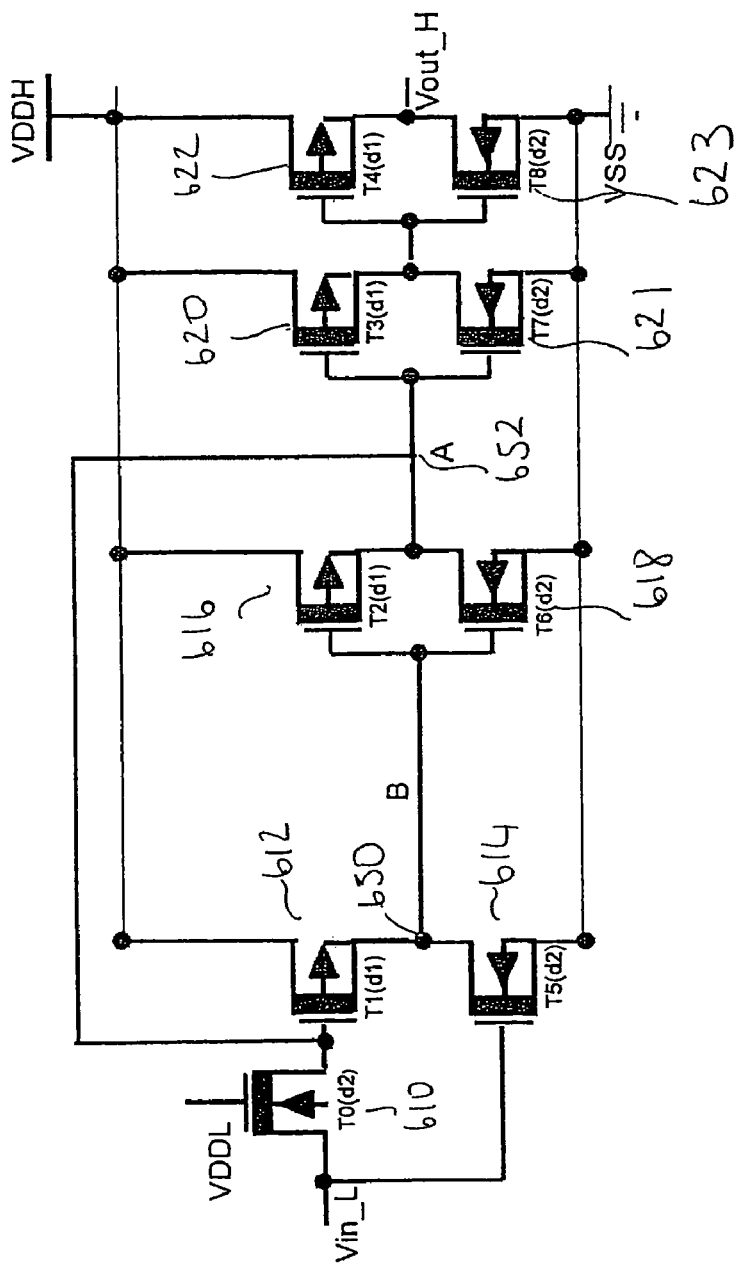
FIG. 6 is a voltage level shifter according to a second embodiment of the present invention.

FIG. 6 schematically illustrates a second embodiment of a single well voltage level system according to the present invention. The circuit of FIG. 6 is functionally equivalent to the circuit of FIG. 3, but instead of CMOS transistors, the circuit is constructed using Carbon Nano Tube Field Effect Transistors (CNTFETs). The circuit of FIG. 6 is structurally similar to the arrangement of FIG. 3, with the exception that the inverters 320, 322 (on output path) in FIG. 3 are each replaced by a pair of CNTFET transistors and are both connected to both the high voltage domain VDDH and the ground voltage VFS.

The circuit 600 of FIG. 6 comprises a pass transistor 610, a set of four switching CNTFET transistor 612, 614, 616, 618 corresponding respectively to the transistors 312, 314, 316 and 318 of FIG. 3. The transistors 612, 616 whose sources are connected to VDDH each have a diameter d1 whereas the transistors 614, 618 each have a diameter of d2. Similarly to the arrangement of FIG. 3 the transistors 616 and 618 together form an inverter. As in the FIG. 3 embodiment, there is a circuit path from a node 652 at the output of the inverter connecting back to the output of the pass transistor 610.

A pair of CNTFET transistors 620, 621 forms a first output path inverter. The transistor 620 has a diameter d1 and the transistor 621 has a diameter d2. This first inverter 620, 621 is connected in series to a pair of transistors 622, 623 forming a second output path inverter that the signal must pass through prior to being provided at Vout_H.

Similarly to the embodiment of FIG. 3, the embodiment of FIG. 6 works by isolating the node 652 from VDDH when the logical input is zero via the transistor 616 thus providing a strong zero at node 652. By using appropriate P-type CNT-FET and N-type CNTFET by selecting the required diameters d1,d2 of the transistors, the level shifter system of FIG. 6 can be realised to be functionally equivalent to the CMOS transistor system of FIG. 3.

FIGS. 7A and 7B are tables schematically illustrating a comparison between the known dual Nwell architecture of FIG. 1 and the single Nwell architecture of the embodiment of FIG. 3 for the characteristics of rise delay, fall delay, dynamic power ratio and leakage power ratio. In the tables of FIGS. 7A and 7B "Arch 1" corresponds to the previously known dual NWELL voltage shifter of FIG. 1 whereas "Arch 3" corresponds to the single NWELL voltage shifter of the FIG. 3 embodiment.

The left-most column in FIGS. 7A and 7B specifies parameters for the PVT (Power Voltage Temperature) corners used in the simulations in the case of a 32 nanometer technology process node, which means that the minimum length of the gate of the device/transistor is 32 nanometers. For example, "ff_nominal_min_1p10v_1p10v_125c" corresponds to fast NMOS and fast PMOS (ff), nominal resistance and nominal capacitance at the condition of minimum congestion, 1.10V input voltage, 1.10V output voltage and a temperature of 125 centigrade (125 c) and "ss_nominal_max_0 p76v_0p90v_m40c" corresponds to slow NMOS and slow PMOS (ss), nominal resistance, nominal capacitance (nominal), 0.76 input voltage, 0.90 output voltage and a temperature of −40 degrees centigrade (m40 c).

FIGS. 8 and 9 are tables giving performance characteristics and comparisons of the FIG. 1 architecture (known dual NWELL) and the FIG. 3 architecture (single NWELL embodiment) only in the functional corners for which it is most important that the single NWELL design functions efficiently.

FIG. 8 is a table providing a leakage comparison of the voltage level comparison of the voltage level shifters of FIG. 1 of the known Standard Cell and the architecture of FIG. 3 according to an embodiment of the present invention. In the table of FIG. 8 the column "PVT corners" specifies the relevant set of power, voltage and temperature parameters applied to each of the architecture of FIG. 1 and the architecture of FIG. 3. In particular, the parameter set "leak_fff_125_1p155_1p155" corresponds to a leakage corner for fast NMOS and fast PMOS Monte Carlo simulation corner at 125 degrees Celsius temperature, an input voltage of 1.155V and an output voltage of 1.155V.

The column "VSS_leak_0" of FIG. 8 specifies leakage (in micro-Amps) at the ground node when the logic level of the input/output is zero. The column "VSS_leak_1" specifies leakage (in micro-Amps) at the ground node when the logic level of the input/output is one. The right-most column gives the total leakage current in micro-Amps. The total leakage current of the single Nwell embodiment of FIG. 3 os 0.35 micro-Amps, whereas the total leakage of the known dual Nwell embodiment of FIG. 1 is only slightly lower at 0.27 micro-Amps.

FIG. 9 is a table that specifies an overall leakage comparison between the loan dual Standard Cell of FIG. 1 and the embodiment of FIG. 3. The column "PVT corners" specifies the power, voltage and temperature characteristics being applied to the architecture under test. The PVT corner "del_ss_m40_0 p72_0 p72" corresponds to delay from input to output at slow NMOS and slow PMOS from voltage level 0.72V to voltage level 0.72V. The PVT corner "del_ss_m40_0p72_1p155" corresponds to delay from input to output at slow NMOS and slow PMOS from voltage level 0.72V to voltage level 1.155V. The PVT corner "del_tt_25_0p72_0p72" corresponds to delay from input to output for typical NMOS and typical PMOS from voltage level 0.72V to voltage level 0.72V.

The next column in the table of FIG. 9 specifies the rise delay in nanoseconds and the following column the fall delay in nano-seconds. The right-most column specifies the total dynamic power consumption of the corresponding circuit for the given PVT corner parameters.

It can be seen from the tables of FIG. 8 and FIG. 9 that the level shifter of the embodiment of FIG. 3 has reliable functionality in the slow PMOS, fast NMOS corner in the lower voltage domain. This is the critical corner in terms of functionality.

Overall the results presented in the tables of FIGS. 7A, 7B, 8 and 9 show that the single Nwell architecture of the embodiment of FIG. 3 is comparable in terms of performance characteristics (leakage current, delay, dynamic power) to the known dual Nwell level shifter of FIG. 1. Furthermore, the FIG. 3 single Nwell architecture is functional in the "critical corner" of parameter space corresponding to slow PMOS, fast NMOS, input voltage 0.72V, output voltage 1.155V and temperature −40 centigrade. The results in the tables also demonstrate that the single Nwell shifter of FIG. 3 performs well and comparably with the dual Nwell architecture of FIG. 1 in standard voltage domains and process corners. This can be seen for example from the 4$^{th}$ row from the bottom of the table of FIG. 7B corresponding to "tt_nominal_max_1p00v_1p10v_25c" i.e. typical NMOS and typical PMOS, nominal resistance and nominal capacitance at the condition of maximum possible congestion with an input voltage of 1.00V and output voltage 1.10V and 25 degrees celsius. It can be seen from this entry in the FIG. 7B table that for this set of parameters the rise delay difference is such that Architecture 1 (corresponding to FIG. 1 dual Nwell arrangement) is 5.7 picoseconds slower than Architecture 3 (corresponding to FIG. 3 embodiment), the fall delay difference is such that Architecture 1 is 15.5 picoseconds slower than Architecture 3, the dynamic power ratio is such that Architecture 1 consumes 1.1 times more power than Architecture 3 and the leakage power ratio (Architecture 1[FIG. 1]/Architecture 3[FIG. 3]) is 97.7 i.e. Architecture 1 is 97.7 times more leaky than Architecture 3.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A voltage level shifter for receiving an input signal from an input voltage domain and converting said signal to a shifted signal in a shifted voltage domain, said voltage level shifter comprising:
   an input for receiving said input signal from said input voltage domain;
   switching circuitry arranged between a voltage rail at a supply voltage and a voltage rail at a ground voltage;

a pass transistor located in a path between said input and said switching circuitry;

an output connected to a node of said switching circuitry for outputting said shifted digital signal;

wherein said switching circuitry and said pass transistor are configured to isolate an output of said pass transistor from said supply voltage rail when said input signal corresponds to a logical zero driving said output of said pass transistor to said ground voltage through said pass transistor and configured to drive said output of said pass transistor to said supply voltage when said input signal corresponds to a logical one, thereby providing full feedback to said output of said pass transistor, wherein a gate of said pass transistor is connected to a TIEHI Standard Cell with a non-zero voltage lower than said supply voltage.

2. Voltage level shifter as claimed in claim 1, wherein said switching circuitry comprises a pull-up transistor connected to said input via said pass transistor and comprises a pull-down transistor connected to said input via a signal path bypassing said pass transistor.

3. Voltage level shifter as claimed in claim 2, wherein said switching circuitry comprises inverter circuitry.

4. Voltage level shifter as claimed in claim 3, wherein said inverter circuitry is configured to perform said isolation of said output of said pass transistor from said supply voltage rail when said input voltage domain corresponds to a logical zero.

5. Voltage level shifter as claimed in claim 4, wherein said inverter circuitry comprises an NMOS transistor and a PMOS transistor.

6. Voltage level shifter according to claim 5, wherein said pass transistor has a low threshold voltage relative to a threshold voltage of said PMOS transistor of said inverter circuitry.

7. Apparatus as claimed in claim 6, wherein said PMOS transistor of said inverter circuitry performs said isolation of said output of said pass transistor from said supply voltage rail when said first voltage domain corresponds to a logical zero.

8. Voltage level shifter as claimed in claim 7, wherein said switching circuitry comprises a first node located between a drain of said NMOS transistor and a drain of said PMOS transistor and a drain of said pass transistor.

9. Voltage level shifter as claimed in claim 8, wherein said switching circuitry comprises a second node located between a drain of said pull-up transistor and a drain of said pull-down transistor and wherein an input of said inverter circuitry is connected to said second node.

10. Voltage level shifter as claimed in claim 4, wherein an output of said inverter circuitry is connected to an input of said pull-up transistor.

11. Voltage level shifter as claimed in claim 1, comprising at least one inverter connected in series in a signal path leading to said output.

12. Voltage level shifter as claimed in claim 1, wherein said voltage level shifter is a standard-cell component in a standard-cell library of a circuit design tool.

13. Voltage level shifter as claimed in claim 1, wherein said switching circuitry comprises at least one complementary metal oxide semiconductor (CMOS) transistor.

14. Voltage level shifter as claimed in claim 1, wherein said switching circuitry comprises at least one Carbon Nano Tube Field Effect transistor.

15. Voltage level shifter as claimed in claim 1, comprising a single voltage domain NWELL.

16. Voltage level shifter as claimed in claim 1, having single height.

17. A method of shifting a voltage level voltage level of input signal from an input voltage domain by converting said input signal to a shifted signal in a shifted voltage domain, said method comprising:

receiving at an input said input signal from said input voltage domain;

arranging switching circuitry between a voltage rail at a supply voltage and a voltage rail at a ground voltage;

locating a pass transistor in a path between said input and said switching circuitry;

connecting an output to a node of said switching circuitry for outputting said shifted digital signal;

wherein said switching circuitry and said pass transistor are configured to isolate an output of said pass transistor from said supply voltage rail when said input signal corresponds to a logical zero driving said output of said pass transistor to said ground voltage through said pass transistor and configured to drive said output of said pass transistor to said supply voltage when said input signal corresponds to a logical one, thereby providing full feedback to said output of said pass transistor, wherein a gate of said pass transistor is connected to a TIEHI Standard Cell with a non-zero voltage lower than said supply voltage.

18. A voltage level shifter for receiving an input signal from an input voltage domain and converting said signal to a shifted signal in a shifted voltage domain, said voltage level shifter comprising:

means for receiving said input signal from said input voltage domain;

means for switching arranged between a voltage rail at a supply voltage and a voltage rail at a ground voltage;

a pass transistor located in a path between said input and said switching circuitry;

means for outputting connected to a node of said switching circuitry for outputting said shifted digital signal;

wherein said means for switching and said pass transistor are configured to isolate an output of said pass transistor from said supply voltage rail when said input signal corresponds to a logical zero driving said output of said pass transistor to said ground voltage through said pass transistor and configured to drive said output of said pass transistor to said supply voltage when said input signal corresponds to a logical one, thereby providing full feedback to said output of said pass transistor, wherein a gate of said pass transistor is connected to a TIEHI Standard Cell with a non-zero voltage lower than said supply voltage.

19. A voltage level shifter for receiving an input signal from an input voltage domain and converting said signal to a shifted signal in a shifted voltage domain, said voltage level shifter comprising:

an input for receiving said input signal from said input voltage domain;

switching circuitry arranged between a voltage rail at a supply voltage and a voltage rail at a ground voltage;

a pass transistor located in a path between said input and said switching circuitry;

an output connected to a node of said switching circuitry for outputting said shifted digital signal;

wherein said switching circuitry and said pass transistor are configured to isolate an output of said pass transistor from said supply voltage rail when said input signal corresponds to a logical zero driving said output of said pass transistor to said ground voltage through said pass transistor and driving said shifted digital signal to zero volts and configured to drive said output of said pass transistor to said supply voltage when said input signal corresponds to a logical one, thereby providing full feedback to said output of said pass transistor.

* * * * *